(12) United States Patent
Lee (10) Patent No.: US 7,615,399 B2
(45) Date of Patent: Nov. 10, 2009

(54) FABRICATION METHOD OF COMPLEMENTARY METAL OXIDE SEMICONDUCTOR IMAGE SENSOR

(75) Inventor: Chiu-Te Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/754,307

(22) Filed: May 27, 2007

(65) Prior Publication Data
US 2007/0231945 A1 Oct. 4, 2007

Related U.S. Application Data

(62) Division of application No. 11/162,118, filed on Aug. 29, 2005.

(51) Int. Cl.
*H01L 21/00* (2006.01)
(52) U.S. Cl. .......................... 438/70; 438/66; 257/292; 257/440; 257/E27.133
(58) Field of Classification Search ................. 257/292, 257/440, 431, E27.133; 438/57, 66, 69, 70
See application file for complete search history.

(56) References Cited

U.S. PATENT DOCUMENTS

| 7,193,289 B2 * | 3/2007 | Adkisson et al. ............ 257/431 |
| 2004/0140564 A1 * | 7/2004 | Lee et al. ..................... 257/758 |
| 2004/0251395 A1 * | 12/2004 | Takahashi et al. ........ 250/208.1 |

* cited by examiner

*Primary Examiner*—Wael Fahmy
*Assistant Examiner*—John C Ingham
(74) *Attorney, Agent, or Firm*—Jianq Chyun IP Office (57) ABSTRACT

A fabrication method of a CMOS image sensor including a light-receiving element, at least one transistor, a first dielectric layer, a reflective layer, a second dielectric layer, a protective layer, a material layer, a transparent material layer, an optical filter, and a converging element is provided. The light-receiving element and the transistor are disposed respectively inside the light sensing region and the transistor region. The first dielectric layer is disposed on the substrate, covering the transistor and the light-receiving element. The reflective layer is disposed on the first dielectric layer inside the light sensing region. The second dielectric layer is disposed on the first dielectric layer outside the reflective layer. The material layer is disposed on the first dielectric layer inside the reflective layer. The optical filter is disposed on the transparent material layer. The converging element is disposed on the optical filter inside the light sensing region.

18 Claims, 10 Drawing Sheets

FABRICATION METHOD OF COMPLEMENTARY METAL OXIDE SEMICONDUCTOR IMAGE SENSOR

CROSS-REFERENCE TO RELATED APPLICATION

This application is a divisional application of a prior application Ser. No. 11/162,118, filed on Aug. 29, 2005, now pending. The entirety of the above-mentioned patent application is hereby incorporated by reference herein and made a part of this specification.

BACKGROUND OF THE INVENTION

1. Field of Invention

The present invention is related to an optical device and a fabrication method thereof. In particular, it is related to a CMOS image sensor and a fabrication method thereof.

2. Description of Related Art

Because CMOS image sensor (CIS) is compatible with CMOS technology, CIS can be easily integrated with other peripheral circuits on the same chip, thus greatly reducing the cost and consumption power of the image sensor. Accordingly, during recent years, the importance of the CMOS image sensor keeps increased and CIS has become dominant over charge coupled device (CCD) in the lower-priced market applications.

U.S. Pat. No. 6,861,686 discloses a structure of a CMOS image sensor and a fabrication method thereof for resolving the issues derived from the use of copper in replacement of aluminum for the fabrication of interconnect.

However, certain problems are still unsolved by U.S. Pat. No. 6,861,686. For instance, the external light passes through the lens, the color filter, into the metal interconnect line, and is then collected by the photodiode. However, as the external light passes through the light passageway in the metal interconnect line, the external light may be absorbed by the dielectric layer, protective layer, or other thin film layers on the surface of the light passageway if it does not directly reach the photodiode. As a result, the photosensitivity of the CMOS image sensor is reduced.

SUMMARY OF THE INVENTION

The objective for the present invention is to provide a complementary metal-oxide semiconductor (CMOS) image sensor and a fabrication method thereof, which is able to increase the light intensity sensed by the CMOS image sensor, thereby increasing the photosensitive efficiency thereof is increased.

The present invention proposes a CMOS image sensor, which includes a light-receiving element, at least one transistor, a first dielectric layer, a reflective layer, a second dielectric layer, a protective layer, a material layer, a transparent material layer, an optical filter, and a converging element. The light-receiving element is disposed inside the light sensing region in the substrate, the transistor is disposed inside the transistor region in the substrate, and the transistor and the light-receiving element are electrically coupled. Furthermore, the first dielectric layer is disposed on the substrate and the transistor and the light-receiving element are covered by the first dielectric layer. In addition, the reflective layer is disposed on the first dielectric layer inside the light sensing region. Furthermore, the second dielectric layer is disposed on the first dielectric layer at an internal side of the reflective layer. The protective layer is disposed on the second dielectric layer, and the material layer is disposed on the first dielectric layer at an internal side of the reflective layer. The transparent material layer is disposed above the material layer, the protective layer, and the reflective layer. The optical filter is disposed on the transparent material layer. The converging element is disposed on the optical filter inside the corresponding light sensing region.

According to an embodiment of the present invention, the aforementioned reflective layer is, for example, a conductive layer. The material of the conductive layer is, for example, copper, aluminum, or tungsten.

According to an embodiment of the present invention, the aforementioned reflective layer is a conductive spacer structure. Furthermore, the reflective layer is formed from a plurality of conductive structures coupling together.

According to an embodiment of the present invention, the CMOS image sensor further includes an metal interconnect line which is disposed between the first dielectric layer and the second dielectric layer inside the transistor region. And the metal interconnect line and the transistor are electrically coupled. The material of the reflective layer and the material of the metal interconnect line are the same. In addition, the aforementioned CMOS image sensor further includes a solder pad disposed in the protective layer and on a portion of the protective layer. And the solder pad and the metal interconnect line are electrically coupled. The material of the reflective layer and the material of the solder pad are the same.

According to an embodiment of the present invention, the material of the aforementioned material layer and the material of the transparent material layer are the same.

According to an embodiment of the present invention, the material of the aforementioned material layer is formed from the materials of the second dielectric layer and of the protective layer.

According to an embodiment of the present invention, the aforementioned converging element is, for example, a lens.

According to an embodiment of the present invention, the aforementioned light-receiving element is, for example, a photodiode.

The present invention proposes a fabrication method of another CMOS image sensor. First, a light-receiving element is formed inside the light sensing region in the substrate. At least one transistor electrically-coupled to the light-receiving element is formed at the transistor region in the substrate. Later, the dielectric layer is formed on the substrate, wherein the metal interconnect line which is electrically coupled to the transistor in the dielectric layer is formed inside the transistor region. Later, a protective layer is formed above the substrate, and the dielectric layer and the metal interconnect line are covered by the protective layer. Later, a portion of the protective layer and a portion of the dielectric layer are removed, and a first opening above the light-receiving element is formed. In addition, the reflective layer is formed on the sidewall of the first opening. The transparent material layer is then formed, and the protective layer and the reflective layer are covered by the transparent material layer. The first opening is filled. Later, the optical filter on the transparent material layer is formed, and the converging element is formed on a portion of the optical filter inside the corresponding light sensing region.

According to an embodiment of the present invention, the aforementioned reflective layer is, for example, a conductive layer. The material of the conductive layer is, for example, copper, aluminum, or tungsten.

According to an embodiment of the present invention, the fabrication method of the aforementioned reflective layer is, for example, first the formation of a conductive layer on the substrate, in which the protective layer is covered by the conductive layer. The first opening is filled. Later, an anisotropic etching process is performed for removing a portion of the conductive layer. A conductive spacer structure is formed on the sidewall of the first opening for use as the reflective layer.

According to an embodiment of the present invention, the aforementioned reflective layer and the solder pad are formed at the same time. The fabrication method is, for example, at the same time that the first opening is formed, the formation of the second opening of the metal interconnect line that is exposed on the second side of the protective layer inside the transistor region. Later, the conductive layer is formed above the substrate, and the protective layer is covered by the conductive layer. And the first opening and the second opening are filled by the conductive layer. Later, a photoresist layer is formed above a portion of the conductive layer corresponding to the second opening. Later, an etching process is performed using the photoresist layer as a mask for removing a portion of the conductive layer, for forming a solder pad in the second opening inside the transistor region and on a portion of the protective layer at both sides, and for forming a reflective layer on the sidewall of the first opening of the light sensing region at the same time.

According to an embodiment of the present invention, the fabrication method of the aforementioned metal interconnect line is, for example: (a) a first dielectric layer is formed at the first side, and a transistor and a light-receiving element are covered by the first dielectric layer; (b) at least one plug for the electrically coupled transistor is formed in the first dielectric layer; (c) at least one conductor for the electrically coupled plug is formed above a portion of the first dielectric layer; (d) a second dielectric layer is formed on the first dielectric layer of which is not yet covered by the conductor; and (e) step (a)-(d) are repeated for forming the predetermined layers of the metal interconnect lines.

According to an embodiment of the present invention, the fabrication method for the aforementioned metal interconnect line is, for example, a dual damascene method.

According to an embodiment of the present invention, the aforementioned converging element is, for example, a lens.

According to an embodiment of the present invention, the aforementioned light-receiving element is, for example, a photodiode.

The present invention further proposes a fabrication method of a CMOS image sensor. The light-receiving element is first formed in the light sensing region in the substrate. At least one transistor for the electrically coupled light-receiving element is formed inside the transistor region in the substrate. Later, a first dielectric layer is formed on the substrate, wherein an metal interconnect line which is electrically coupled to the transistor in the dielectric layer is formed inside the transistor region at the same time. At least one first conductive structure which is not coupled to the light-receiving element is formed in a portion of the dielectric layer inside the light sensing region. Later, a protective layer is formed above the substrate, and the dielectric layer, the conductive structure, and the metal interconnect line are covered by the protective layer. A transparent material layer is formed on the protective layer. Furthermore, an optical filter is formed on the transparent material layer, and a converging element is formed on a portion of the optical filter inside the corresponding light sensing region.

According to an embodiment of the present invention, the material of the aforementioned first reflective layer is, for example, a conductive layer. The material of the conductive layer is, for example, copper, aluminum, or tungsten.

According to an embodiment of the present invention, the aforementioned first conductive structure and the metal interconnect line are formed at the same time, wherein the fabrication method is, for example: (a) a first dielectric layer is formed on the substrate; (b) a plug for the transistor which is electrically coupled inside the first dielectric layer is formed; (c) a conductor which is electrically coupled to the plug is formed above the first dielectric layer inside the transistor region, and at the same time a conductive structure is formed above the first dielectric layer inside the light sensing region; (d) a second dielectric layer is formed on the first dielectric layer which is not covered by the conductor and the conductive structure; and (e) step (a)-(d) are repeated for forming the predetermined layers of the metal interconnect lines. The fabrication method of the metal interconnect line is, for example, the dual damascene fabrication method.

According to an embodiment of the present invention, a second reflective layer is further formed in the protective layer inside the light sensing region, and the second reflective layer is correspondingly formed on the first reflective layer. The fabrication method for the second reflective layer is, for example, the forming of an opening or a trench on the protective layer inside the light sensing region. Later, a conductive layer is formed above the substrate, and the protective layer is covered by the conductive layer, and the opening or the trench is filled. Later, an etching process is performed for removing a portion of the conductive layer and for forming a second reflective layer in the sidewall of the opening or trench. Furthermore, the second reflective layer and a solder pad are formed at the same time, wherein the fabrication method is, for example, the forming of the first opening of the first reflective layer exposed at the first side in the protective layer inside the light sensing region, and the forming of the second opening of the metal interconnect line exposed at the first side in the protective layer inside the transistor region. Later, a conductive layer is formed on the substrate, and the protective layer is covered by the conductive layer. The first opening and the second opening are filled by the conductive layer. Later, a photoresist layer is formed at above a portion of the conductive layer corresponding to the second opening. Later, an etching process is performed using a photoresist layer as a mask for removing a portion of the material layer. A solder pad is formed in the second opening of the transistor region and on a portion of the protective layer at both sides, and at the same time the second reflective layer is formed in the protective layer inside the light sensing region.

According to an embodiment of the present invention, the aforementioned converging element is, for example, a lens.

According to an embodiment of the present invention, the aforementioned light-receiving element is, for example, a photodiode.

A reflective layer is fabricated in the present invention inside the image sensor for reflecting the light to increase the light intensity sensed by the image sensor and to improve the photosensitive efficiency of the image sensor. In addition, the reflective layer can be formed at the same time as the solder pad; therefore, the process is simple and fabrication cost can be saved. Furthermore, the reflective layer can be formed at the same time as the metal layer of the interconnect layer, which can likewise save fabrication cost.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
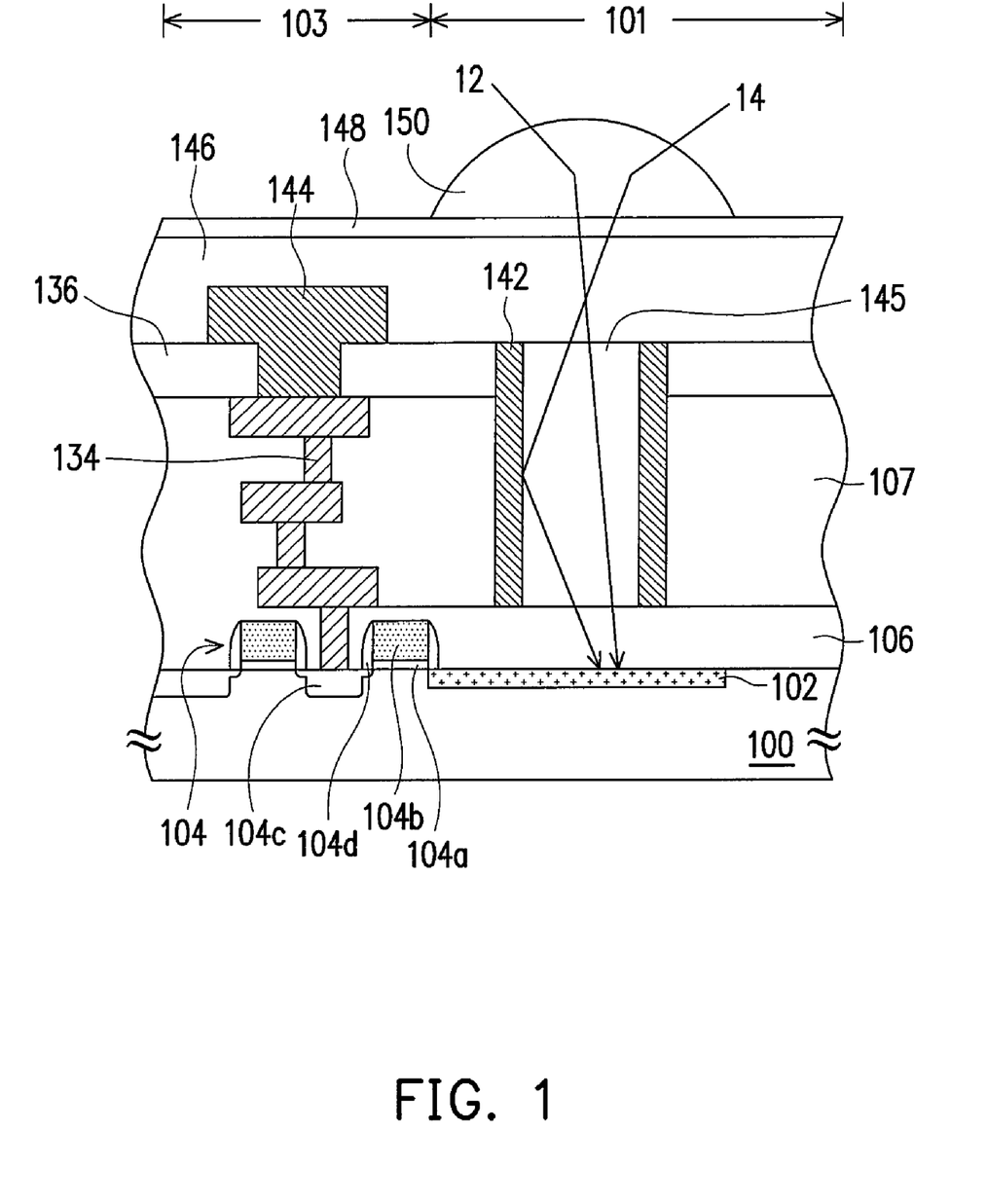
FIG. 1 is a cross-sectional view schematically illustrating a CMOS image sensor, according to an embodiment of the present invention.

FIG. 1 is a cross-sectional view schematically illustrating a CMOS image sensor, according to an embodiment of the present invention.

Referring to FIG. 1, the CMOS image sensor of the present invention includes a light-receiving element 102, a transistor 104, a reflective layer 142, a protective layer 136, a transparent material layer 146, a material layer 145, an optical filter 148, a converging element 150, and a dielectric layer 106, 107. The light-receiving element 102 is disposed inside the light sensing region 101 of the substrate 100. The light-receiving element 102 is, for example, a photodiode. The transistor 104 is disposed inside the transistor region 103 of the substrate 100, and the transistor 104 and the light-receiving element 102 are electrically coupled. The transistor 104 includes a gate dielectric layer 104a, a gate 104b, a source/drain region 104c and a spacer 104d. The dielectric layer 106 is disposed on the substrate 100, and the transistor 104 and the light-receiving element 102 are covered by the dielectric layer 106. The reflective layer 142 is disposed on the dielectric layer 106 inside the light sensing region 101. The reflective layer 142 is, for example, a conductive layer. The material of the conductive layer is, for example, copper, aluminum, tungsten or other appropriate conductive materials. In particular, the reflective layer 142 is, for example, a tubular conductive spacer structure, or it is formed from a plurality of tubular conductive structures coupling together. Furthermore, the dielectric layer 107 is disposed on the dielectric layer 106 outside of the tubular reflective layer 142. And the protective layer 136 is disposed on the dielectric layer 107. The material for the protective layer 136 is, for example, silicon oxide, silicon carbide, silicon nitride, or other appropriate materials. Furthermore, the material layer 145 is disposed on the dielectric layer 106 and inside of the reflective layer 142. The transparent material layer 146 is disposed on top of the material layer 145 and the reflective layer 142, and on the protective layer 136. The material of the transparent material layer 146 can be, for example, dielectric materials, i.e. silicon oxide or silicon nitride, or photoresist materials. In an embodiment of the present invention, the material of the material layer 145 and the material of the transparent material layer 146 are the same. In another embodiment of the present invention, the material layer 145 is formed from two materials, the same materials of the dielectric layer 107 and the protective layer 136. Furthermore, the optical filter 148 is disposed on the transparent material layer 146, and the converging element 150 is disposed on the optical filter 148 inside the range of the light sensing region 101. The converging element 150 is, for example, a lens.

In an embodiment of the present invention, the CMOS image sensor further includes an metal interconnect line 134 disposed between the dielectric layers 106, 107 for coupling the transistor 104. Furthermore, the material of the reflective layer 142 can be the same as tha of the metal interconnect line 134.

In another embodiment of the present invention, the CMOS image sensor further includes a solder pad 144 disposed in the protective layer 136 and extended to the transparent material layer 146 on the protective layer 136. The solder pad 144 and the metal interconnect line 134 are electrically coupled. Furthermore, the material of the reflective layer 142 is the same as the material of the solder pad 144.

Indeed, the metal interconnect line 134 having three layers of interconnect layers is used as an illustrative example in the aforementioned embodiment. However, the metal interconnect line in the present invention is not limited by the examples. The number of layers of the metal interconnect line 134 can be modified based on the circuit design or process requirements.

Importantly, as illustrated in a light path 12 in FIG. 1, when light enters into the CMOS image sensor, the converging element 150 is able to focus light, so that light passes through the optical filter 148, penetrates the transparent material layer 146, the material layer 145, and the dielectric layer 106, and then is collected by the light-receiving element 102 disposed in the substrate 100. On the other hand, if light focused by the converging element 150 passes through the optical filter 148 and is not directly impacted on the light-receiving element 102, the reflective layer 142 is able to reflect and redirect light to the light-receiving element 102 as shown in the light path 14.

In other words, the reflective layer 142 is able to reflect the light to the light-receiving element 102, thus increasing the light detection intensity by the CMOS image sensor and enhancing the photosensitivity thereof. As a result, the conventional issues of light absorbance by the dielectric layer and other thin films can be resolved, and the photosensitive efficiency of the image sensor is thereby improved. Most importantly, as the size of the light-receiving element 102 decreases with higher integration of the device, the detected light intensity is also decreased. However, the reflective layer 142 is capable of improving photosensitive efficiency of the CMOS image sensor.

Furthermore, the fabrication method for the CMOS image sensor is illustrated by means of two embodiments in the present invention, but the present invention is not limited hereto. One of the major features is that a reflective layer is formed inside the CMOS image sensor for reflecting the incident light.

FIG. 2A to FIG. 2G are cross-sectional views schematically illustrating a fabrication process for the CMOS image sensor, according to an embodiment of the present invention, wherein in FIG. 2A to FIG. 2G, the components that are the same as in FIG. 1 have the same reference numbers.

Figure 2A:
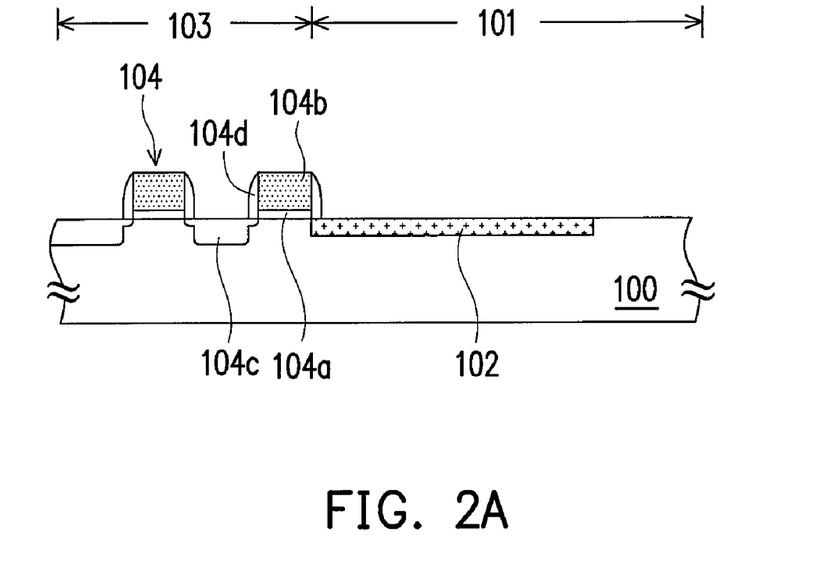
FIGS. 2A to FIG. 2G are cross-sectional views schematically illustrating a fabrication process for the CMOS image sensor, according to an embodiment of the present invention.

Referring to FIG. 2A, the light-receiving element 102 is formed inside the light sensing region 101 in the substrate 100. At least one transistor 104 is formed inside the transistor region 103 on the substrate 100, and the transistor 104 and the light-receiving element 102 are electrically coupled. The light-receiving element 102 is, for example, a p-n junction photodiode in the substrate 100. In other words, the light-receiving element 102 is, for example, formed by forming an n-doped region in a p-type substrate. Furthermore, the aforementioned transistor 104 includes the gate dielectric layer 104a, the gate 104b, the source/drain region 104c and the spacer 104d.

Figure 2B:
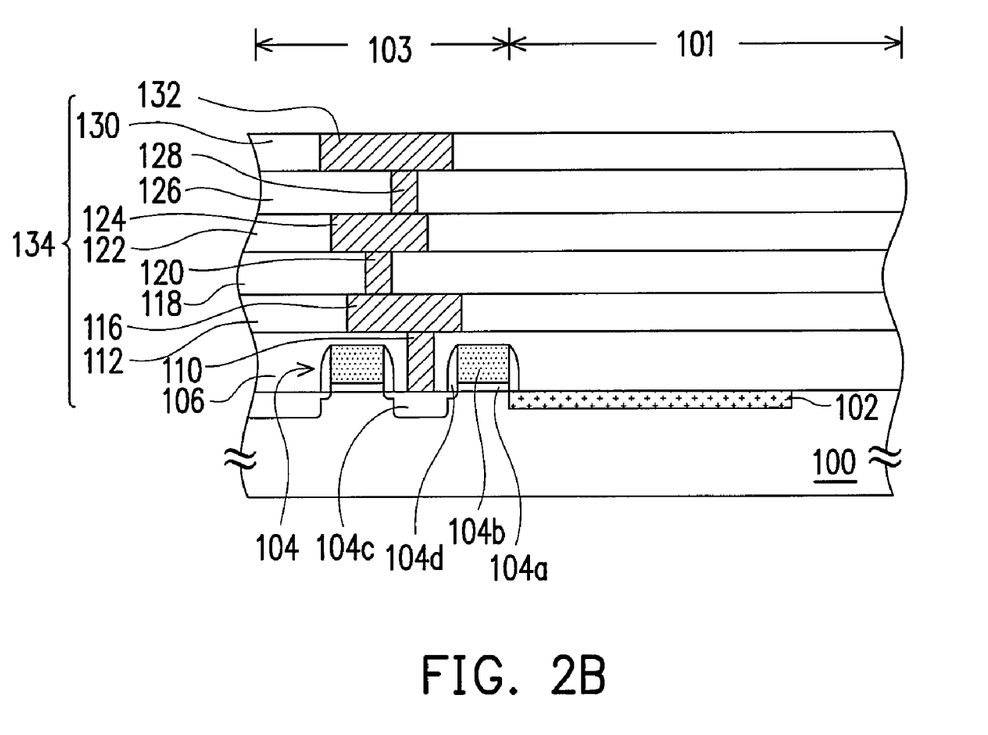

Later, referring to FIG. 2B, the metal interconnect line 134 which is coupled to the transistor 104 is formed on the substrate 100. The exemplary fabrication method is described as follows. At first, a dielectric layer 106 is formed on the substrate 100. Later, a plug 110 is formed in the dielectric layer 106. The conductor 116 which is electrically coupled to the plug 110 is formed above the dielectric layer 106. The dielectric layer 112 is formed on the dielectric layer 106 which is not covered by the conductor 116. Later, the dielectric layer 118, the plug 120, the conductor 124, the dielectric layer 122, the dielectric layer 126, the plug 128, the conductor 132, and the dielectric layer 130 are formed sequentially and independently by repeating the above processes. The material of the aforementioned plugs 110, 120, 128 and the conductors 116, 124, 132 can be, for example, copper, aluminum, tungsten, or other appropriate metals.

Figure 3:
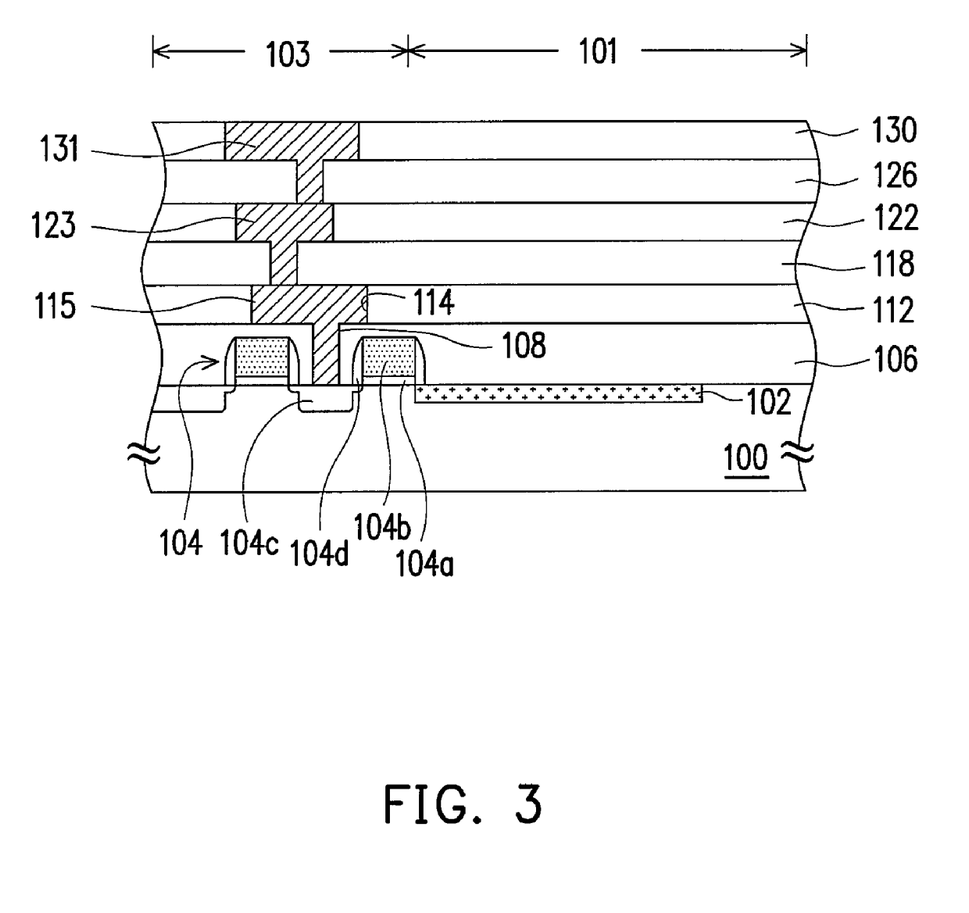
FIG. 3 is a cross-sectional view schematically illustrating an interconnect layer for the CMOS image sensor, according to an embodiment of the present invention.

In an embodiment of the present invention, the metal interconnect line 134, for example, is able to use the dual damascene technology for forming the plug and the conductor at the same time. Referring to FIG. 3, the dielectric layer 106 and the dielectric layer 112 are first sequentially formed. The trench 114 is later formed in the dielectric layer 112 inside the transistor region 103. An opening 108 is formed in the dielectric layer 106 and the metal layer is filled into the opening 108 to form the damascene structure 115. Later, the aforementioned procedures are repeated, so that the dielectric layer 118, the dielectric layer 122, the damascene structure 123, the dielectric layer 126, the dielectric layer 130, and the damascene structure 131 are sequentially formed to complete the metal interconnect line 134.

Figure 2C:
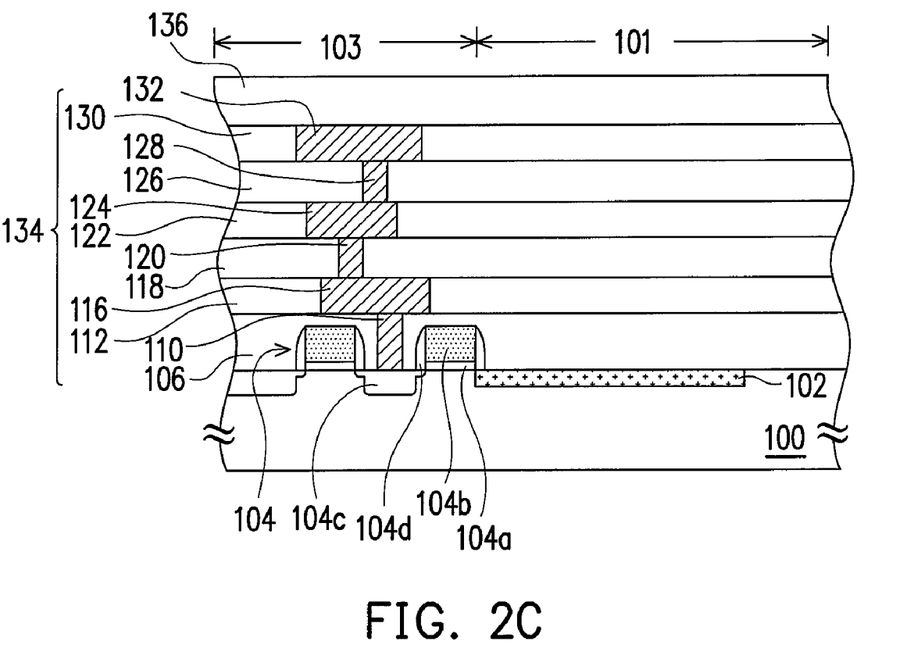

Referring to FIG. 2C, a protective layer 136 is formed above the substrate 100. The material for the protective layer 136 is, for example, silicon oxide, silicon carbide, silicon nitride, or other appropriate materials, formed by chemical vapor deposition or other appropriate methods. The function of the aforementioned protective layer 136 is for protecting the metal layer 132 in the interconnect layer 134 from damages.

Figure 2D:
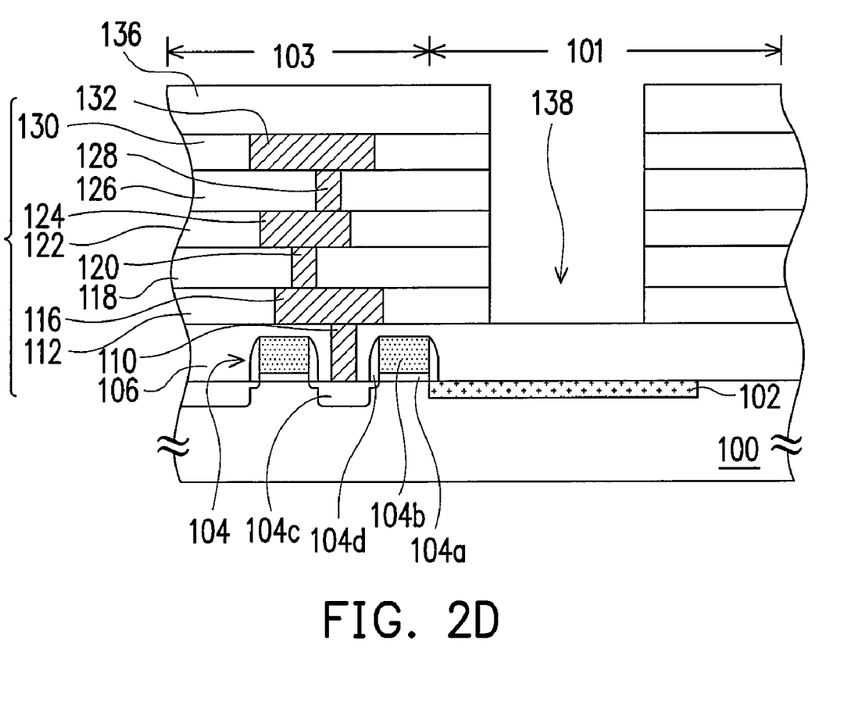

Later, referring to FIG. 2D, a portion of the protective layer 136 and a portion of the interconnect layer 134 are removed to form an opening 138 above the light-receiving element 102. The fabrication of the opening 138, for example, includes forming a patterned photoresist layer (not shown) on the protective layer 136, and etching a portion of the protective layer 136 and a portion of the interconnect layer 134 by using the patterned photoresist layer as a mask.

Figure 2E:
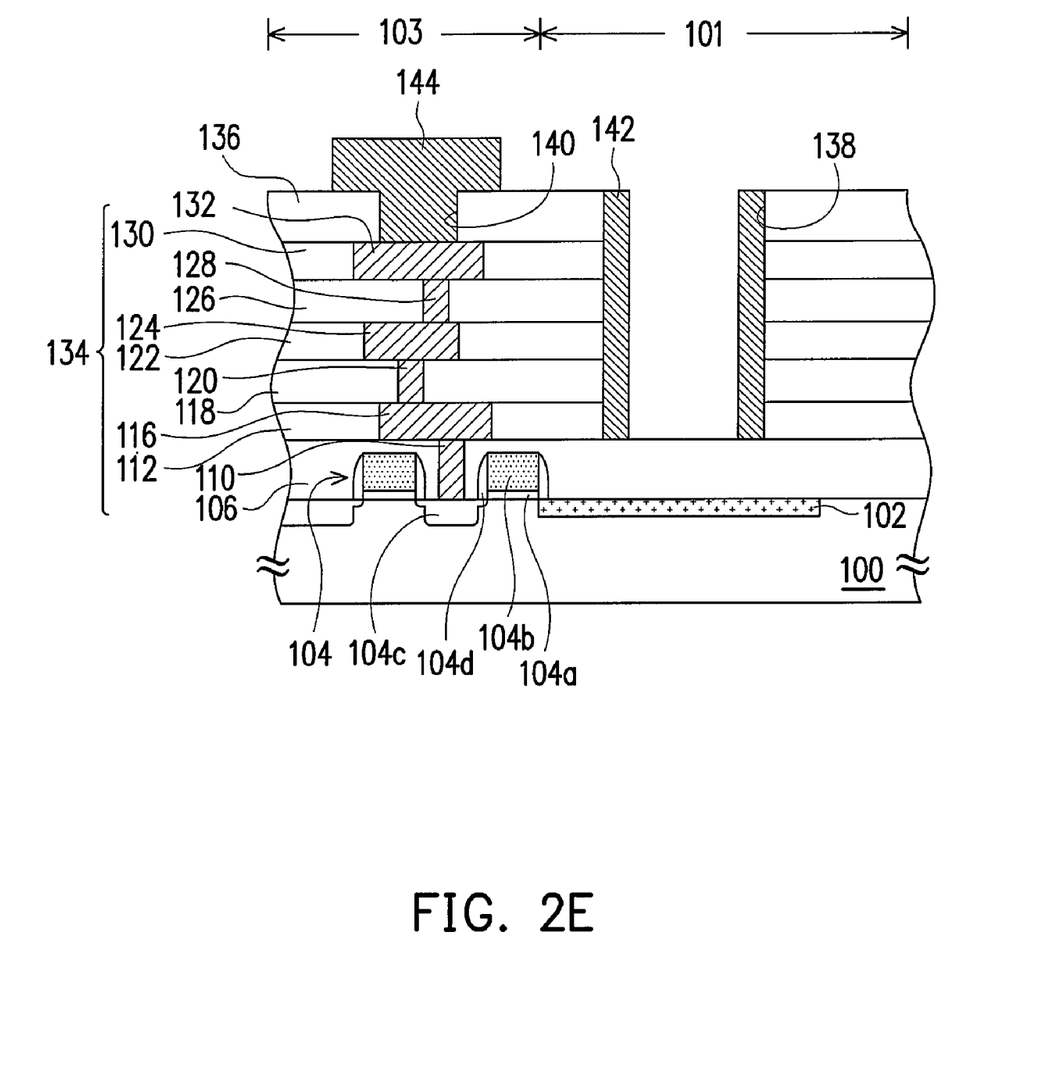

Referring to FIG. 2E, a reflective layer 142 is formed on the sidewall of the opening 138. The material of the reflective layer 142 is, for example, copper, aluminum, tungsten, or other appropriate conductive material. In addition, the fabrication for the reflective layer 142, for example, includes forming a conductive layer (not shown) above the substrate 100 and in the opening 138, and performing an anisotropic etching process for removing a portion of the conductive layer, so as to form a tubular conductive spacer structure surrounded by the sidewall of the opening 138, which refers as the reflective layer 142.

In an embodiment of the present invention, the conductive layer 142 is formed at the same time as the solder pad 144; therefore, the process is relatively simple, and fabrication cost is lower. The fabrication of the solder pad 144, for example, includes forming the solder pad opening 140 in the protective layer 136 to expose the metal layer 132 at the same time as the opening 138 is formed. Later, a conductive layer (not shown) is formed above the substrate 100, covering the protective layer 136 and filling the openings 138, 140. Later, a photoresist layer (not shown) is formed on the conductive layer at the location corresponding to the solder pad opening 140. Later, an etching process is performed by using the photoresist layer as a mask, a portion of the conductive layer is removed to form a solder pad 144 (as shown in FIG. 2E) in the opening 140 and on the protective layer 136 at both sides of the opening 140 and to form the reflective layer 142 on the sidewall of the opening 138 at the same time. Afterwards, the photoresist layer is removed. In the present embodiment, the reflective layer 142 and the solder pad 144 are formed of the same material. Furthermore, the aforementioned solder pad 144 is electrically coupled to the metal interconnect line 134, and used as external access for the device on the substrate 100.

Figure 2F:
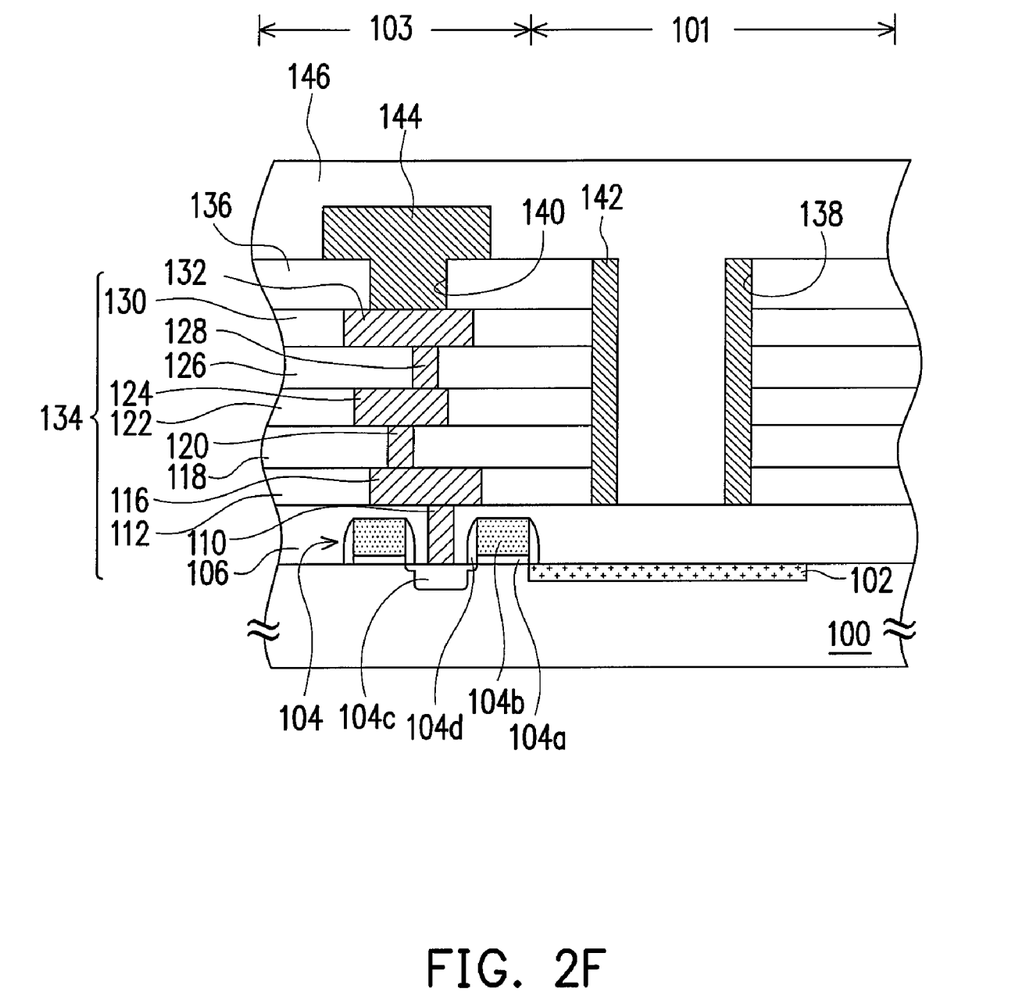

Later, referring to FIG. 2F, a transparent material layer 146 is formed above the substrate 100. The solder pad 144, the protective layer 136 and the conductive layer 142 are covered by the transparent material layer 146. In addition, the opening 138 is filled by the transparent material layer 146. The material of the transparent material layer 146 is, for example, silicon oxide, silicon nitride, other dielectric materials, or photoresist materials.

Figure 2G:
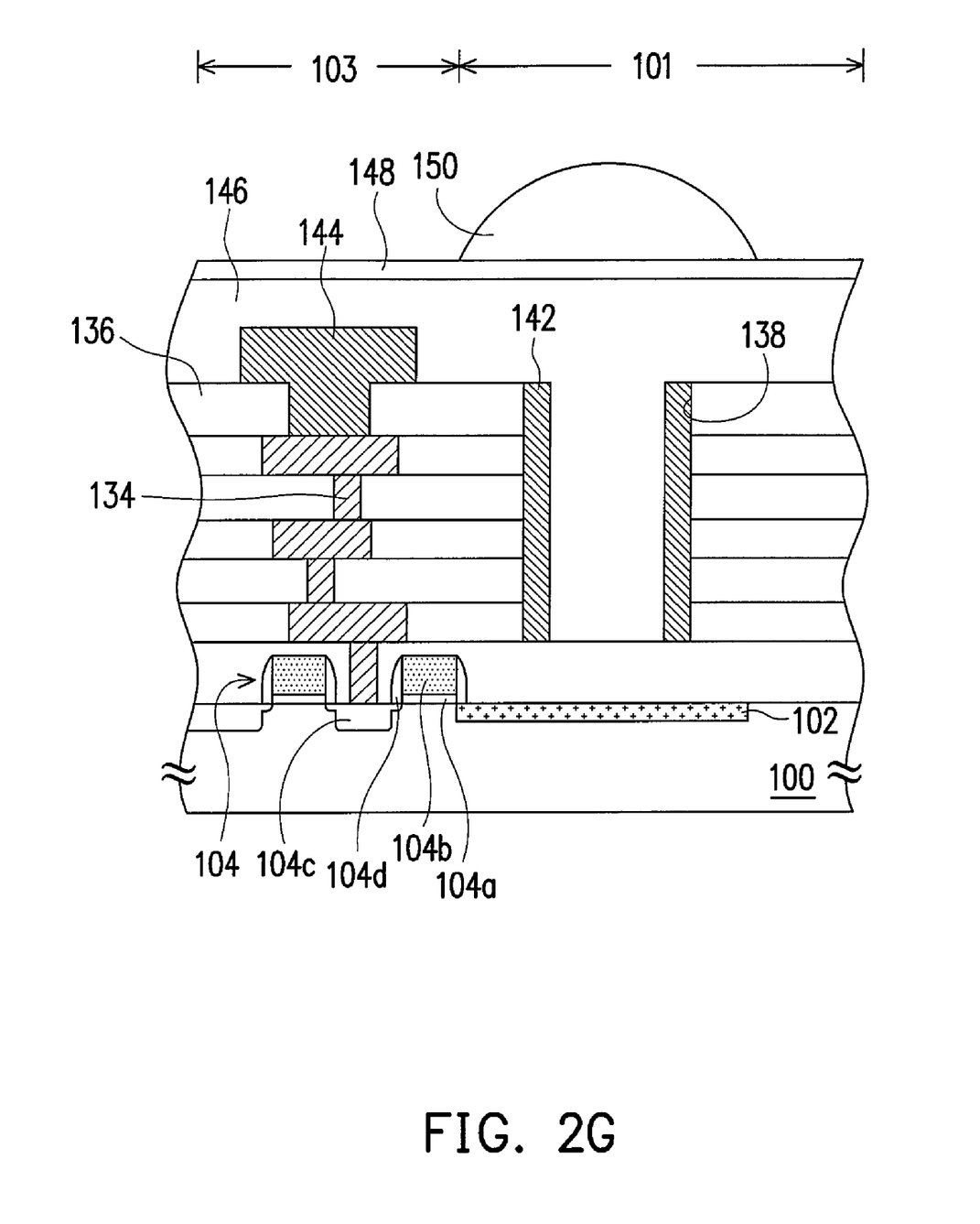

Later, referring to FIG. 2G, an optical filter 148 is formed on the transparent material layer 146. The optical filter 148, for example, is a color filter for allowing certain designated wavelength of light for passing through. The optical filter 148 typically has three different colors (i.e. red, blue, and green). Later, a converging element 150 is formed on a portion of the optical filter 148 inside the corresponding light sensing region 101. The converging element 150 is, for example, a lens.

Figure 4A:
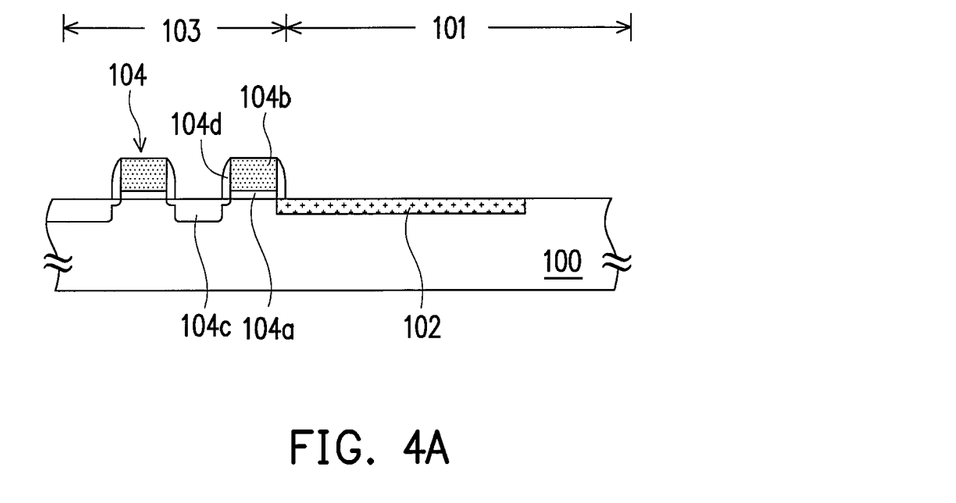
FIGS. 4A to FIG. 4C are cross-sectional views schematically illustrating the fabrication process for the CMOS image sensor, according to another embodiment of the present invention.
Figure 4B:
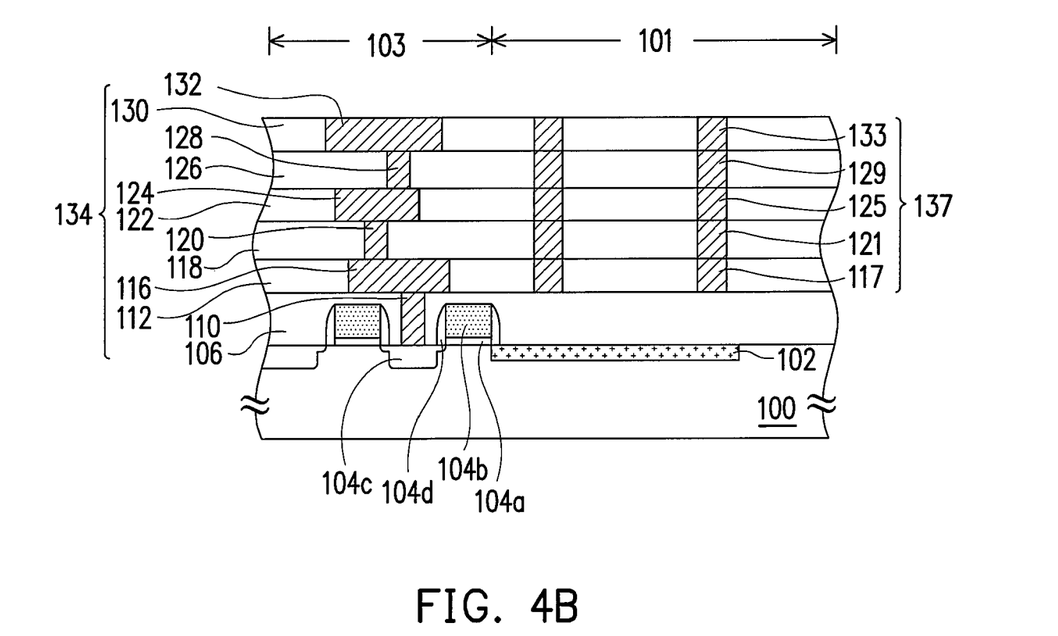
Figure 4C:
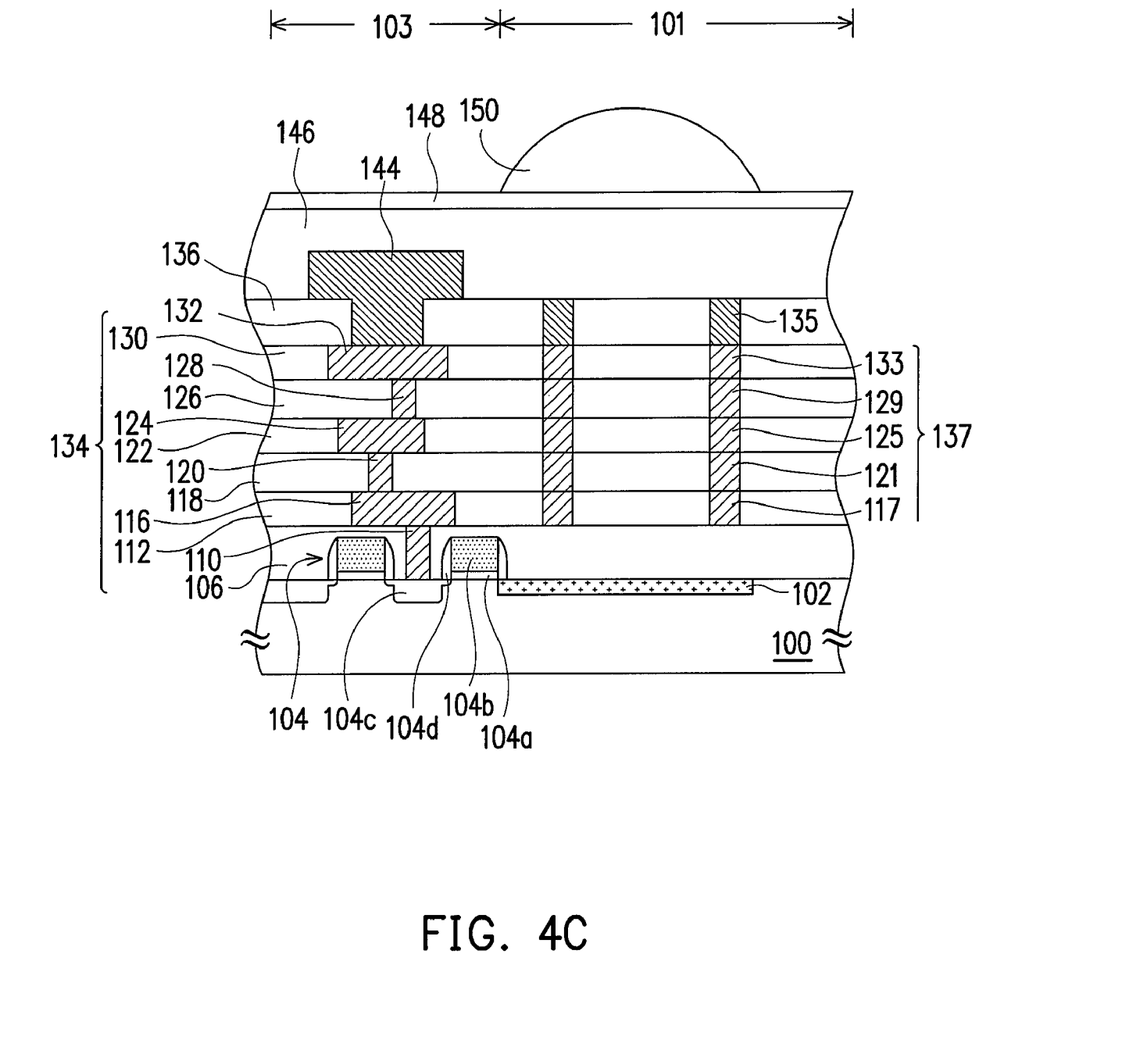

FIG. 4A to FIG. 4C are cross-sectional views schematically illustrating the process of fabricating the CMOS image sensor, according to another embodiment of the present invention. In FIG. 4A to FIG. 4C, the components which are the same as in FIG. 1 and having the same reference numbers are ignored.

First, referring to FIG. 4A, the light-receiving element 102 is formed inside the light sensing region 101 in the substrate 100. At least one transistor 104 is formed inside the transistor region 103 in the substrate 100. The transistor 104 and the light-receiving element 102 are electrically coupled.

Referring to FIG. 4B, an metal interconnect line 134 is formed inside the transistor region 103, and at the same time a reflective layer 137 is formed inside the light sensing region 101. The metal interconnect line 134 can be formed by firstly forming the dielectric layer 106 above the substrate 100 and then forming the plug 110 within the dielectric layer 106. Later, a metal layer (not shown) is deposited on the dielectric layer 106 and then patterned in order to form a conductor 116 inside the transistor region 103 and a conductive structure 117 inside the light sensing region 101 at the same time. Later, the dielectric layer 118, the plug 120, the conductive structure 121, the conductor 124, the conductive structure 125, the dielectric layer 122, the dielectric layer 126, the plug 128, the conductive structure 129, the conductor 132, the conductive structure 133, and the dielectric layer 130 are sequentially formed according to the aforementioned processes. The aforementioned conductive structures 117, 121, 125, 129, 133 form the reflective layer 137. For example, the aforementioned conductive structures are ring-like, and thus form a tubular reflective layer. The material for the plugs 110, 120, 128 and the conductors 116, 124, 132 can be, for example, copper, aluminum, tungsten, or other appropriate metal. And the material for the reflective layer 137, the plugs 110, 120, 128, and the conductors 116, 124, 132 are the same. In particular, because the reflective layer 137 can be formed at the same time as the metal interconnect line 134 is formed, the fabrication process is simplified and more cost-effective.

Figure 5:
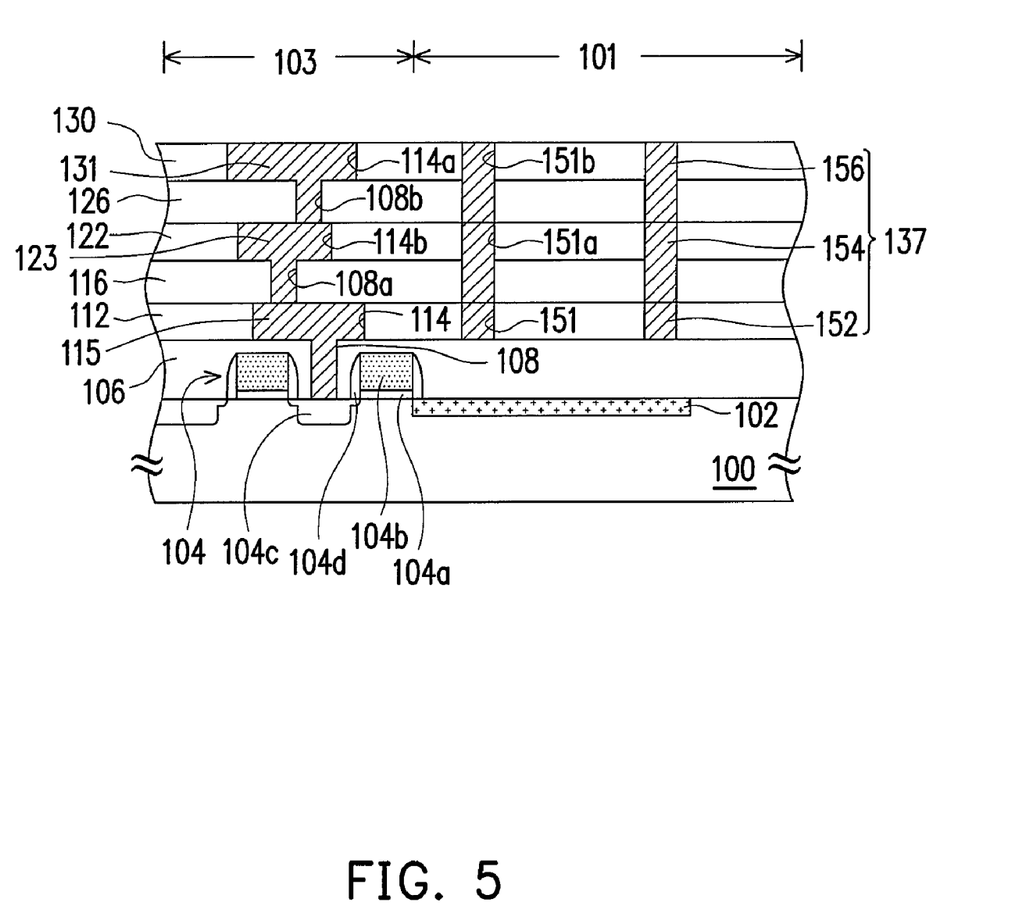
FIG. 5 is a cross-sectional view schematically illustrating an interconnect layer for the CMOS image sensor, according to another embodiment of the present invention.

In an embodiment of the present invention, the plugs and the conductors in conventional interconnect can be formed using the dual damascene technology for the metal interconnect line 134. Similarly, when forming the metal interconnect line 134, the reflective layer 137 is formed at the same time. Referring to FIG. 5, the fabrication method includes firstly forming the dielectric layer 106 and the dielectric layer 112 sequentially. Later, the trench 114 is formed in the dielectric layer 106 and the dielectric layer 112 inside the transistor region 103. The opening 108 is formed in the dielectric layer 106 and at the same time the trench 151 is formed in the dielectric layer 106 and the dielectric layer 112 inside the light sensing region 101. After filling a metal material layer into the trench 151, the damascene structure 115 is formed within the transistor region 103 and the conductive structure 152 is formed within the light sensing region 101. The aforementioned steps are repeated and the dielectric layer 116, the dielectric layer 122, the damascene structure 123, the conductive structure 154, the dielectric layer 126, the dielectric layer 130, the damascene structure 131, and the conductive structure 156 are sequentially formed to complete the fabrication of the metal interconnect line 134 and the reflective layer 137.

Referring to FIG. 4C, the protective layer 136 is formed above the substrate 100. Later, the transparent material layer 146 is formed on the protective layer 136 and the optical filter 148 is formed on the transparent material layer 146. In addition, the converging element 150 is formed on a portion of the optical filter 148 inside the corresponding light sensing region 101.

In another embodiment of the present invention, after forming the protective layer 136, a reflective layer 135 can further be formed in the protective layer 136 inside the light sensing region 101. The reflective layer 135 is formed right on the reflective layer 137. The reflective layer 135 can be formed by, for example, forming an opening or a ring-like trench in the protective layer 136 to expose the reflective layer 133 and a conductive layer (not shown) is formed over the protective layer 136. Later, an etching process is performed for removing the extra conductive layer so as to form the reflective layer 135 either on the sidewall of the opening or within the ring-like trench. If the reflective layer 135 is formed on the sidewall of the opening in the protective layer 136, the transparent material layer 146, which is pre-fabricated, is formed covering the protective layer 136 and the reflective layer 135 and filled the opening. That is, the reflective layer 135 and the transparent material layer 146 are made of the same material. Furthermore, if the reflective layer 135 is formed within the ring-like trench in the protective layer 136, a portion of the protective layer 136 is disposed inside the reflective layer 135.

Furthermore, the reflective layer 135 and the solder pad 144 can be formed at the same time. For example, during forming the opening or the trench in the protective layer 136 to expose the reflective layer 133, the solder pad opening 140 is formed in the protective layer 136 at the same time to expose the metal layer 130. Later, a conductive layer (not shown) is formed above the substrate 100 covering the protective layer 136. After forming a photoresist layer (not shown), an etching process is performed using the photoresist layer as a mask for removing a portion of the conductive layer, thus forming the solder pad 144 on the protective layer 136 within the transistor region 103 and forming the reflective layer 135 inside the light sensing region 101 at the same time. Later, the photoresist layer is removed.

In summary, the present invention includes the following advantages:

1. The present invention provides a tubular reflective layer above the light-receiving element or photodiode, and the reflective layer is capable of reflecting light to the light-receiving element or photodiode for increasing the detected light intensity by the light-receiving element or photodiode, thereby increasing the photosensitive efficiency of the image sensor.
2. The reflective layer of the present invention can be formed simultaneously with the solder pad; therefore, the fabrication process is simplified, and the fabrication costs become lower.
3. The reflective layer in the present invention can be formed simultaneously with the metal layer(s) inside the interconnect metal layer.
4. The present invention can improve the photosensitive efficiency for the image sensor by increasing the light intensity detected by the light-receiving element or the photodiode.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A fabrication method of a complementary metal-oxide semiconductor (CMOS) image sensor, comprising:
   forming a light-receiving element inside a light sensing region in a substrate;
   forming at least one transistor which is electrically coupled to the light-receiving element inside a transistor region on the substrate;
   forming a dielectric layer on the substrate, wherein a metal interconnect line electrically coupled to the transistor is formed in the dielectric layer inside the transistor region;
   forming a protective layer above the substrate, covering the dielectric layer and the metal interconnect line;
   removing a portion of the protective layer and a portion of the dielectric layer to form a first opening above the light-receiving element;
   forming a reflective layer on a sidewall of the first opening, wherein the reflective layer comprises a conductive layer and is formed as a whole after the first opening is formed;
   forming a transparent material layer, covering the protective layer and the reflective layer and filling the first opening;
   forming an optical filter on the transparent material layer; and
   forming a converging element on a portion of the optical filter inside the light sensing region.

2. The fabrication method of a CMOS image sensor according to claim 1, wherein a material of the conductive layer comprises copper, aluminum, or tungsten.

3. The fabrication method of a CMOS image sensor according to claim 1, wherein the step of forming the reflective layer further comprises:

forming a conductive layer above the substrate, covering the protective layer, and filling the first opening; and performing an anisotropic etching process, removing a portion of the conductive layer to form a conductive spacer structure on the sidewall of the first opening as the reflective layer.

4. The fabrication method for an image sensor according to claim 1, wherein the reflective layer and a solder pad are formed at the same time.

5. The fabrication method for a CMOS image sensor according to claim 4, wherein the step of forming the solder pad further comprises:

forming a second opening exposing the metal interconnect line in the protective layer within the transistor region at the same time as the first opening within the light sensing region is formed;

forming a conductive material layer above the substrate, covering the protective layer and filling the first opening and the second opening;

forming a photoresist layer above the conductive material layer corresponding to the second opening;

performing an etching process, using the photoresist layer as mask, to remove a portion of the conductive material layer, so that a solder pad in the second opening and on the protective layer at both sides of the opening is formed inside the transistor region and the reflective layer on the sidewall of the first opening inside the light sensing region is formed at the same time; and removing the photoresist layer.

6. The fabrication method of a CMOS image sensor according to claim 1, wherein the converging element comprises a lens.

7. The fabrication method of a CMOS image sensor according to claim 1, wherein the light-receiving element comprises a photodiode.

8. A fabrication method of a complementary metal-oxide semiconductor (CMOS) image sensor, comprising:

forming a light-receiving element in a light sensing region in a substrate;

forming at least one transistor which is electrically coupled to the light-receiving element inside a transistor region in the substrate;

forming a dielectric layer on the substrate, wherein a metal interconnect line electrically coupled with the transistor is formed in the dielectric layer inside the transistor region, and simultaneously at least one first conductive structure is formed, as a first reflective layer, in the dielectric layer above the light-receiving element without coupling with the light-receiving element, wherein each sidewall of the first reflective layer contacts the dielectric layer;

forming a protective layer above the substrate, covering the dielectric layer, the first reflective layer and the metal interconnect line;

forming a transparent material layer on the protective layer;

forming an optical filter on the transparent material layer; and forming a converging element on a portion of the optical filter corresponding to the light sensing region.

9. The fabrication method for a CMOS image sensor according to claim 8, wherein a material for the first reflective layer comprises a conductive layer.

10. The fabrication method for a CMOS image sensor according to claim 9, wherein a material for the conductive layer comprises copper, aluminum, or tungsten.

11. The fabrication method for a CMOS image sensor according to claim 8, wherein the step for forming the first conductive structure and the metal interconnect line comprises:

(a) forming a first dielectric layer on the substrate;

(b) forming a plug which is electrically coupled to the transistor inside the first dielectric layer;

(c) forming a conductor which is electrically coupled to the plug on the first dielectric layer in the transistor region, and at the same time forming a conductive structure above the first dielectric layer inside the light sensing region;

(d) forming a second dielectric layer on the first dielectric layer which is not covered by the conductor and the conductive structure; and (e) repeating steps (a)-(d), for forming predetermined layers of the metal interconnect line.

12. The fabrication method of a CMOS image sensor according to claim 11, wherein the step for forming the metal interconnect line further comprises:

(a) forming the first dielectric layer and a second dielectric layer sequentially above the substrate;

(b) forming a first trench in the second dielectric layer inside the transistor region and forming a first opening which is coupled to the first trench in the first dielectric layer, and simultaneously forming a first ring trench in the second dielectric layer inside the light sensing region;

(c) filling a first conductive layer into the first trench, the first opening and the first ring trench to form a first damascene structure in the first dielectric layer and the second dielectric layer inside the transistor region, and to form a first conductive structure in the second dielectric layer inside the light sensing region;

(d) forming a third dielectric layer and a fourth dielectric layer above the second dielectric layer sequentially;

(e) forming a second trench in the fourth dielectric layer inside the transistor region, forming a second opening which is coupled with the second trench in the third dielectric layer, and simultaneously forming a second ring trench in the fourth dielectric layer and the third dielectric layer inside the light sensing region;

(f) filling a second conductive layer into the second opening, the second trench and the second ring trench to form a dual damascene structure in the fourth dielectric layer and the third dielectric layer inside the transistor region and form a second conductive structure in the fourth dielectric layer and the third dielectric layer inside the light sensing region; and (g) repeating steps (d)-(f) for forming predetermined layers of the metal interconnect line.

13. The fabrication method of a CMOS image sensor according to claim 8, further comprising forming a second reflective layer in the protective layer above the light-receiving element, and the second reflective layer is formed corresponding to the first reflective layer.

14. The fabrication method of a CMOS image sensor according to claim 13, wherein step of forming the second reflective layer comprises:

forming a third opening or a third ring trench in the protective layer inside the light sensing region;

forming a third conductive layer above the substrate, covering the protective layer and filling the third opening or the third ring trench; and performing an etching process to remove a portion of the third conductive layer, so that the second reflective layer is formed on a sidewall of the third opening or the third ring trench.

15. The fabrication method of a CMOS image sensor according to claim 13, wherein the second reflective layer and a solder pad are formed at the same time.

16. The fabrication method of a CMOS image sensor according to claim 15, wherein the step of forming the solder pad comprises:

forming the third opening or the third ring trench exposing the first reflective layer and in the protective layer inside the light sensing region, and forming a fourth opening exposing the metal interconnect line and in the protective layer inside the transistor region;

forming the third conductive layer above the substrate, covering the protective layer and filling the third opening and the fourth opening;

forming a photoresist layer above a portion of the third conductive layer corresponding to the fourth opening;

performing an etching process, using the photoresist layer as mask, to remove a portion of the third conductive layer, in order to form the solder pad in the fourth opening and in the protective layer inside the transistor region, and to form the second reflective layer at the same time inside the light sensing region; and removing the photoresist layer.

17. The fabrication method of a CMOS image sensor according to claim 8, wherein the converging element comprises a lens.

18. The fabrication method of a CMOS image sensor according to claim 8, wherein the light-receiving element comprises a photodiode.

* * * * *